United States Patent [19]
Wilson

[11] Patent Number: 5,006,814
[45] Date of Patent: Apr. 9, 1991

[54] CURRENT AMPLIFIER

[75] Inventor: Colin J. Wilson, Hertfordshire, England

[73] Assignee: W.A. Technology Limited, Cambridge, England

[21] Appl. No.: 420,111

[22] Filed: Oct. 10, 1989

[30] Foreign Application Priority Data

Oct. 26, 1988 [GB] United Kingdom ................ 8825096

[51] Int. Cl.<sup>5</sup> ............................................. H03F 3/68
[52] U.S. Cl. .................................... 330/107; 330/150; 330/310
[58] Field of Search ............... 330/107, 109, 150, 204, 330/302, 303, 306, 310, 311

[56] References Cited

FOREIGN PATENT DOCUMENTS 0201964 11/1986 European Pat. Off. ............ 330/150
0265763 5/1988 European Pat. Off. .
1556106 1/1969 France .

OTHER PUBLICATIONS

Space Science Instrumentation, vol. 1, No. 4, Nov. 1975, pp. 471–492, D. Reidel Publishing Co., Dordrecht, NL; J. N. Stanley et al.: "An Alkali Vapour Magnetometer Using Integrated Circuits".

Primary Examiner—Steven Mottola
Attorney, Agent, or Firm—Jeffers, Hoffman & Niewyk

[57] ABSTRACT

A current amplifier including two stages. A first stage is formed by a primary operational amplifier (IC1) connected in a virtual earth feedback configuration and having a feedback loop formed by a resistor (R1) and capacitor (C1) connected in parallel so that the primary operational amplifier has a frequency response up to a predetermined frequency and thereafter the frequency response rolls off at a predetermined rate. A second stage including another operational amplifier (IC2) connected in a virtual earth or non-inverting feedback configuration having a frequency characteristic chosen to provide in combination with the frequency characteristic of the primary amplifier a desired operating range for the amplifier. The predetermined frequency lies between the frequency extremes of the operating range and the frequency characteristic of the second stage has a constant gain up to said predetermined frequency and a gain matched with and complementary to the roll-off of the primary operational amplifier (IC1) above the predetermined frequency so that the overall frequency response of the current amplifier is flat over its operating range.

13 Claims, 3 Drawing Sheets

CURRENT AMPLIFIER

This invention relates to high quality, very low noise, current amplifiers which are used to amplify very small signals typically in a range from 1 pA to 10 nA.

Such current amplifiers may be used in scanning tunneling microscopes or atomic force microscopes. In scanning tunnelling microscopes a very sharp probe having an end of atomic dimensions is scanned in a raster pattern over a surface to be investigated. A small potential difference of typically 2 volts is established between the probe and the surface to be investigated and the probe is moved towards and away from the surface by a drive including a servo loop. When the probe is very close to the surface, typically of the order of 1 nm, electrons tunnel through the space between the probe and the surface to provide a small tunnelling current. The probe is moved backwards and forwards by its drive under the control of the servo loop to keep this tunnelling current constant. A signal is taken from the servo loop to provide an indication of the height of the surface as the probe is moved over it and it is this signal which, after subsequent processing, is used to provide a picture of the surface to be investigated. The servo loop requires a current amplifier typically having a flat frequency response over a range from DC or 0 to at least 100 kHz.

At present such a current amplifier is usually formed by a high quality low drift, low current operational amplifier connected in a virtual earth feedback configuration. Steps are taken to reduce the parasitic capacitance of the feedback loop to the greatest possible extent and to reduce the resistance of the feedback path to get as flat a frequency response as possible over as large a bandwidth as possible. However, with the conventional amplifiers available it is difficult to get a sufficiently large bandwidth and usually the frequency characteristic of the resulting amplifier rolls off before 100 kHz. This degrades the performance of scanning tunnelling microscope.

It is also known to construct current amplifiers from multiple stages. One example is disclosed in the paper by J. M. Stanley et al., Space Science Instrumentation, vol. 1., no. 4, Nov. 1975, pp 471–492. Conventionally the first stage of such an amplifier has a wide bandwidth with the frequency response of the first stage only being rolled off outside the intended operating range of the amplifier as a whole. The amplifier shown in FIG. 5 of the paper, for example, has a first stage with a response which rolls off in the region of 300 kHz. Subsequent stages have responses which produce a narrow effective operating range from 150 kHz to 210 kHz.

According to this invention a current amplifier includes two stages, a first stage formed by a primary operational amplifier connected in a virtual earth feedback configuration and having a feedback loop formed by a resistor and capacitor connected in parallel so that the primary operational amplifier has a frequency characteristic with a substantially flat frequency response up to a predetermined frequency and thereafter the frequency response rolls off at a predetermined rate, and a second stage including another operational amplifier connected in a virtual earth or non-inverting feedback configuration having a frequency characteristic chosen to provide in combination with the frequency characteristics of the primary amplifier a desired operating range for the amplifier, characterised in that the said predetermined frequency lies between the frequency extremes of the operating range, and the frequency characteristic of the second stage has a substantially constant gain up to said predetermined frequency and a gain matched with and complementary to the roll-off of the primary operational amplifier above the predetermined frequency so that the overall frequency response of the current amplifier is substantially flat over its operating range.

The second stage of the current amplifier may include a further operational amplifier connected in a virtual earth or non-inverting feedback configuration and connected in series with the other operational amplifier. With this arrangement the first operational amplifier in the second stage provides a complementary response to the primary operational amplifier from the predetermined frequency to a second, higher predetermined frequency. The further operational amplifier has a constant gain until the second higher predetermined frequency is reached and then has a gain matched to be complementary with the roll-off of the primary operational amplifier over at least part of the remainder of the operating range of the current amplifier.

With the current amplifier in accordance with this invention by deliberately introducing a significant capacitance in the feedback loop of the primary operational amplifier and increasing the resistance of its feedback loop, there is a considerable reduction in the bandwidth of the primary amplifier over which a substantially flat frequency response is obtained. At the same time, the increase in the impedance of the loop reduces the susceptibility of the amplifier to drift and noise. Typically the flat response is reduced to a maximum of 1 kHz. However, by then compensating for the roll off that occurs in the primary operational amplifier by the inclusion of the second stage having a complementary gain to that of the primary operational amplifier, the bandwidth over which a substantially flat frequency response is obtained is greatly increased. Typically such an amplifier has a substantially flat frequency response up to around 300 KHz. The current amplifier in accordance with this invention has a considerably better signal to noise ratio than a conventional single stage amplifier and its signal to noise ratio is between 10 and 100 times better than the convention and this is particularly important when handling low input currents such as those obtained in scanning tunnelling microscopes.

A particular example of a current amplifier in accordance with this invention will now be described with reference to the accompanying drawings, in which.

Figure 1:
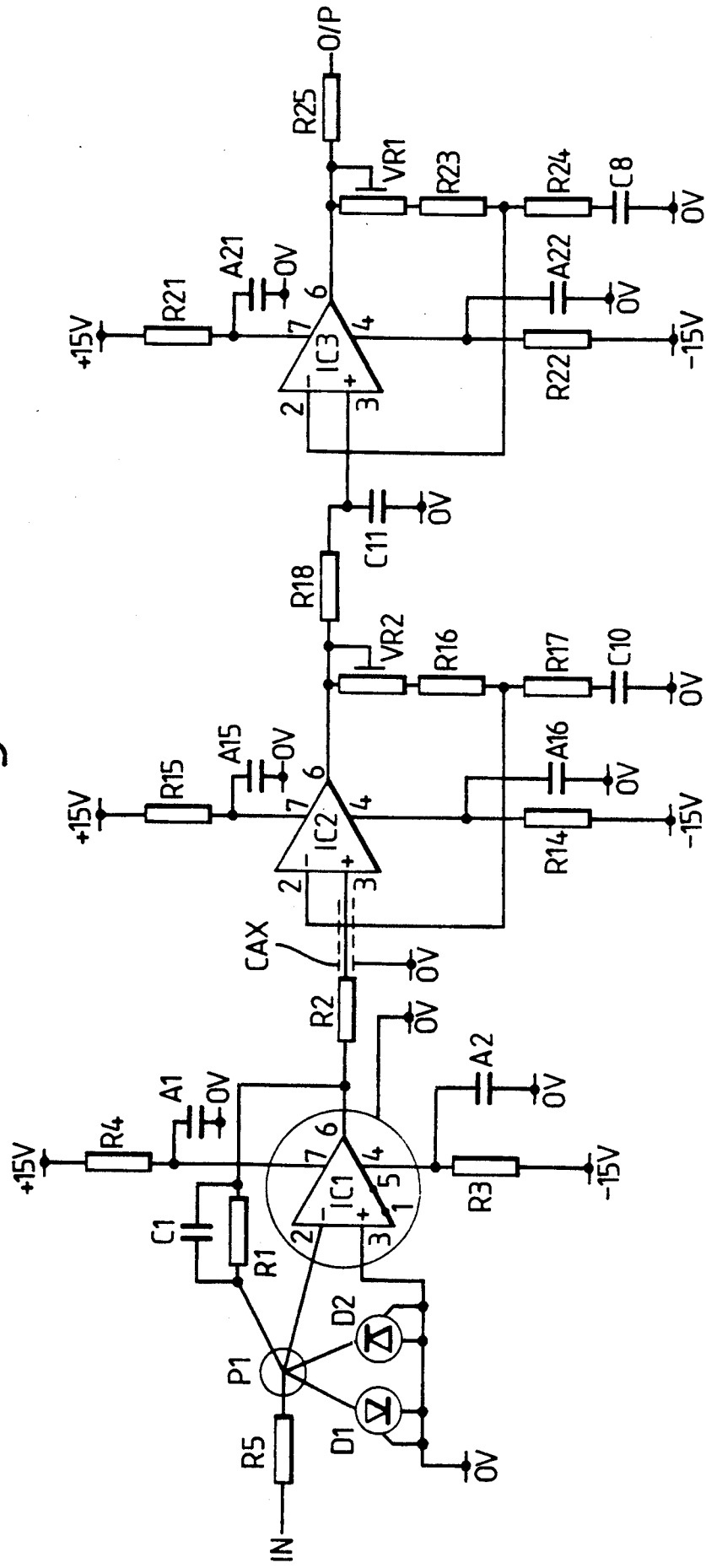
FIG. 1 is a circuit diagram.

A current amplifier in accordance with this invention includes a first stage including a primary operational amplifier IC1 and a second stage including operational amplifiers IC2 and IC3. The primary operational amplifier IC1 is a low drift low current operational amplifier such as a Burr Brown type OPA111 and is connected in a shunt voltage feedback configuration with capacitor C1 and resistor R1 connected in parallel and forming a feedback loop between its output on terminal pin 6 and its inverting input on terminal pin 2. An input resistor R5 is connected between the terminal pin 2 and an input terminal IN of the amplifier. Voltage protection diodes D1 and D2 are connected in parallel between the inverting input terminal 2 and the non-inverting input terminal 1 of the amplifier IC1. The output from operational amplifier IC1 is fed via a series resistor R2 and a coaxial cable CAX to the second stage.

The operational amplifier IC2 is typically of type OP37 such as that manufactured by Precision Monolithics Incorporated, and is connected in a non-inverting feedback configuration. Part of the output from operational amplifier IC2 which is fed via terminal 6 is fed back to its inverting input terminal 2 via a feedback loop including variable potentiometer VR2 and resistor R16. The feedback loop is also coupled to ground via resistor R17 and capacitor C10 which provide the required frequency response for the amplifier IC2. The output from the first stage is fed into the non-inverting input terminal 3 of amplifier IC2. The output from terminal 6 of amplifier IC2 is fed forward via resistor R18 and a bypass capacitor C11 to the non-inverting input terminal 3 of IC3 which is again an operational amplifier of type OP37. This is connected in a non-inverting feedback configuration, generally similar to IC2. Amplifier IC3 has a feedback loop extending from its output terminal 6 via variable potentiometer VR1 and resistor R23 to its inverting input terminal 2. Again the feedback loop is connected to ground via resistor R24 and capacitor C8 which provide the required frequency response for the amplifier IC3. The output for the current amplifier is taken from output terminal OP connected to the output terminal 6 via series resistor R25.

Figure 2:
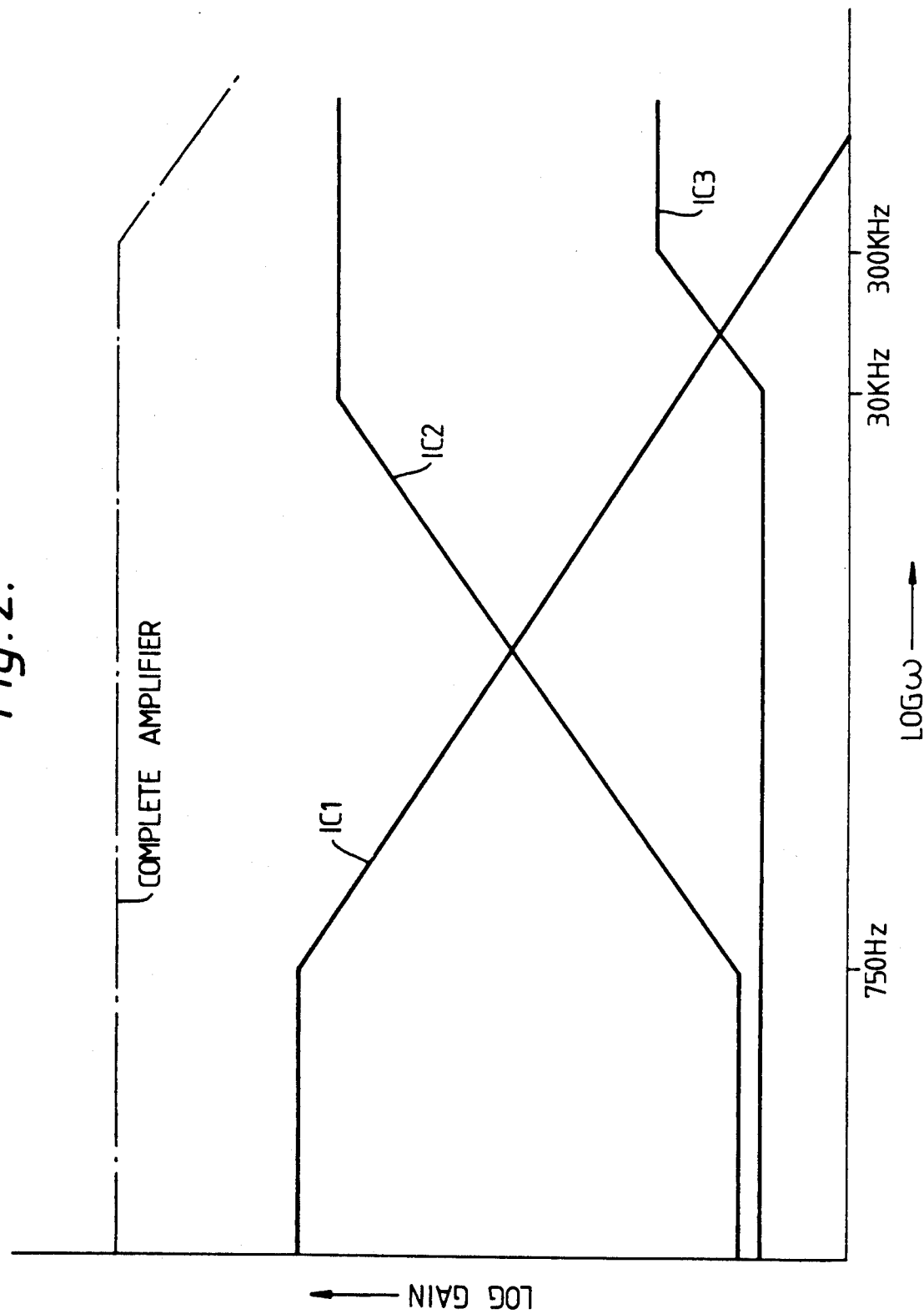
FIG. 2 is a graph showing the frequency response of the individual stages and of the whole current amplifier.

FIG. 2 is a representation of the gain of each of the amplifiers plotted against frequency. FIG. 2 illustrates how the first amplifier IC1 has a flat frequency response until the frequency is around 750 Hz and thereafter rolls off at a fixed rate typically −20 dB per decade. The second amplifier IC2 has a substantially constant unity gain, until a frequency of around 750 Hz. From this point it has a high positive gain preferably matched to that of the roll-off of the first stage and thus preferably it has a gain of +20 dB per decade. Upon saturation which, with this example, occurs around 30 KHz the gain is substantially constant as shown in FIG. 2. The third amplifier IC3 is arranged to have a substantially constant unity gain up to 30 KHz but, from this frequency onwards has a gain of +20 dB per decade to correspond to and complement the roll-off of the first amplifier. The set points at which the second and third amplifiers IC2, IC3 begin their positive gain characteristic is determined by adjustment of variable potentiometers VR2 and VR1, respectively. The three amplifiers produce a combined gain shown in chain dotted lines in FIG. 2 which results in a substantially flat frequency response until around 300 KHz is reached and thereafter rolls off at −20 dB per decade as shown in FIG. 2.

The second stage may include three or more amplifiers.

Figure 3:
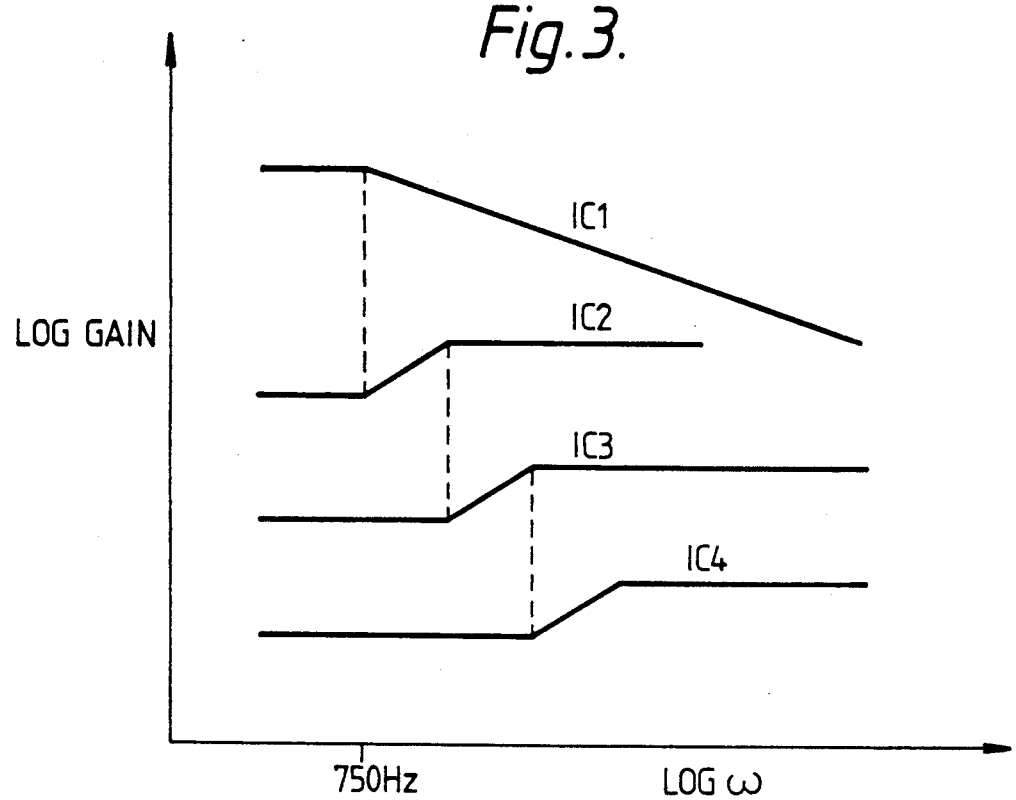
FIG. 3 is a graph showing the frequency response of the individual stages of an alternative embodiment.
Figure 4:
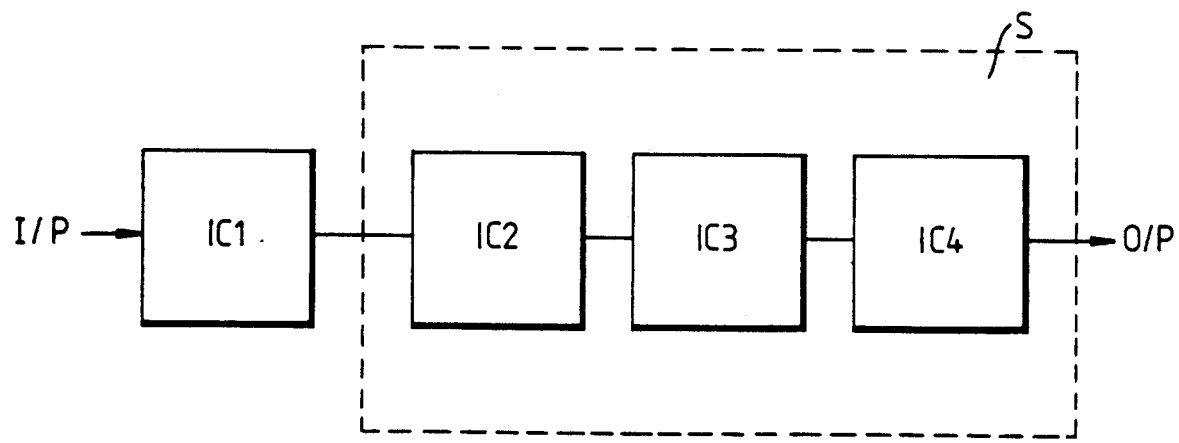
FIG. 4 is a block diagram of the alternative embodiment.

FIG. 4 shows an alternative embodiment including a third operational amplifier IC4 in the second stage. As shown in FIG. 3, the amplifiers of the second stage are arranged in combination to give a response complementary to the roll-off of the primary amplifier IC1 in a manner analogous to that described for the first embodiment.

Typical component values are as follows:

| R1 | 100M | C1 | 2P2 |
|---|---|---|---|
| R2 | 47R | C8 | 1N0 |
| R3 | 47R | C10 | 47N |
| R4 | 47R | C11 | 100P |
| R5 | 120R | A1 | 22N |
| R14 | 47R | A2 | 22N |
| R15 | 47R | A15 | 22N |
| R16 | 2K7 | A16 | 22N |
| R17 | 100R | A21 | 22N |
| R18 | 4K7 | A22 | 22N |
| R21 | 47R | VR1 | 5K |
| R22 | 47R | VR2 | 5K |
| R23 | 2K7 | | |
| R24 | 470R | | |
| R25 | 47R | | |

I claim:

1. A current amplifier including two stages, a first stage formed by a primary operational amplifier connected in a virtual earth feedback configuration and having a feedback loop formed by a resistor and capacitor connected in parallel so that the primary operational amplifier has a frequency characteristic with a substantially flat frequency response up to a predetermined frequency and thereafter the frequency response rolls off at a predetermined rate, and a second stage including another operational amplifier connected in one of a virtual earth and non-inverting feedback configuration having a frequency characteristic chosen to provide in combination with the frequency characteristic of the primary amplifier a desired operating range for the amplifier, characterised in that the said predetermined frequency lies between the frequency extremes of the operating range and the frequency characteristic of the second stage has a substantially constant gain up to said predetermined frequency and a gain matched with and complementary to the roll-off of the primary operational amplifier above the predetermined frequency so that the overall frequency response of the current amplifier is substantially flat over its operating range.

2. A current amplifier according to claim 1, in which the second stage of the current amplifier includes a further operational amplifier connected in one of a virtual earth and non-inverting feedback configuration and connected in series with the operational amplifier, the first operational amplifier in the second stage providing a complementary response to the primary operational amplifier from the predetermined frequency to a second, higher predetermined frequency, and the further operational amplifier having a constant gain until the second higher predetermined frequency is reached and then has a gain matched to be complementary to the roll-off of the primary operational amplifier over at least part of the remainder of the operating range of the current amplifier.

3. A current amplifier according to claim 1 or 2, in which the said predetermined frequency lies towards the lower frequency extreme of the operating range.

4. A current amplifier according to claim 3, in which the operating range extends from substantially D.C. to substantially 300 kHz and the said predetermined frequency is less than substantially 1 kHz.

5. A current amplifier according to claim 4, in which the said predetermined frequency is substantially 750 Hz.

6. A current amplifier according to claim 2 in which said operating range extends from substantially D.C. to substantially 300 kHz, said predetermined frequency is less than substantially 1 kHZ and said higher predetermined frequency is greater than substantially 10 kHz.

7. A current amplifier according to claim 6, in which the higher predetermined frequency is substantially 30 kHz.

8. A current amplifier according to claim 2, in which the second stage of the current amplifier includes a third operational amplifier, the further operational amplifier providing a complementary response to the primary operational amplifier up to a third predetermined frequency higher than the second predetermined frequency, the third operational amplifier having a substantially constant gain up to said third predetermined frequency and a gain complementary to the roll-off of the primary operational amplifier thereafter.

9. The current amplifier according to claim 6, in which the second stage of the current amplifier includes a third operational amplifier, the further operational amplifier providing a complementary response to the primary operational amplifier up to a third predetermined frequency higher than the second predetermined frequency, the third operational amplifier having a substantially constant gain up to said third predetermined frequency and a gain complementary to the roll-off of the primary operational amplifier thereafter.

10. A scanning tunnelling including a current amplifier including two stages, a first stage formed by a primary operational amplifier connected in a virtual earth feedback configuration and having a feedback loop formed by a resistor and capacitor connected in parallel so that the primary operational amplifier has a frequency characteristic with a substantially flat frequency response up to a predetermined frequency and thereafter the frequency response rolls off at a predetermined rate, and a second stage including another operational amplifier connected in one of a virtual earth and non-inverting feedback configuration having a frequency characteristic chosen to provide in combination with the frequency characteristic of the primary amplifier a desired operating range for the amplifier, characterised in that the said predetermined frequency lies between the frequency extremes of the operating range and the frequency characteristic of the second stage has a substantially constant gain up to said predetermined frequency and a gain matched with and complementary to the roll-off of the primary operational amplifier above the predetermined frequency so that the overall frequency response of the current amplifier is substantially flat over its operating range.

11. A scanning tunnelling according to claim 10, in which the second stage of the current amplifier includes a further operational amplifier connected in one of a virtual earth and non-inverting feedback configuration and connected in series with the other operational amplifier, the first operational amplifier in the second stage providing a complementary response to the primary operational amplifier from the predetermined frequency to a second, higher predetermined frequency, and the further operational amplifier having a constant gain until the second higher predetermined frequency is reached and then has a gain matched to be complementary to the roll-off of the primary operational amplifier over at least part of the remainder of the operating range of the current amplifier.

12. An atomic force microscope including a current amplifier including two stages, a first stage formed by a primary operational amplifier connected in a virtual earth feedback configuration and having a feedback loop formed by a resistor and capacitor connected in parallel so that the primary operational amplifier has a frequency characteristic with a substantially flat frequency response up to a predetermined frequency and thereafter the frequency response rolls off at a predetermined rate, and a second stage including another operational amplifier connected in one of a virtual earth and non-inverting feedback configuration having a frequency characteristic chosen to provide in combination with the frequency characteristic of the primary amplifier a desired operating range for the amplifier, characterised in that the said predetermined frequency lies between the frequency extremes of the operating range and the frequency characteristic of the second stage has a substantially constant gain up to said predetermined frequency and a gain matched with an complementary to the roll-off of the primary operational amplifier above the predetermined frequency so that the overall frequency response of the current amplifier is substantially flat over its operating range.

13. An atomic force microscope according to claim 12, in which the second stage of the current amplifier includes a further operational amplifier connected in one of a virtual earth and non-inverting feedback configuration and connected in series with the other operational amplifier, the first operational amplifier in the second stage providing a complementary response to the primary operational amplifier from the predetermined frequency to a second, higher predetermined frequency, and the further operational amplifier having a constant gain until the second higher predetermined frequency is reached and then has a gain matched to be complementary to the roll-off of the primary operational amplifier over at least part of the remainder of the operating range of the current amplifier.

* * * * *